United States Patent
Katsuki et al.

(10) Patent No.: US 8,629,792 B2
(45) Date of Patent: Jan. 14, 2014

(54) A/D CONVERSION CIRCUIT AND TEST METHOD

(75) Inventors: Tomoya Katsuki, Kanagawa (JP); Shinichirou Saitou, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 317 days.

(21) Appl. No.: 13/137,621

(22) Filed: Aug. 30, 2011

(65) Prior Publication Data
US 2012/0013497 A1 Jan. 19, 2012

Related U.S. Application Data

(63) Continuation of application No. 12/662,711, filed on Apr. 29, 2010, now Pat. No. 8,018,362.

(30) Foreign Application Priority Data

May 11, 2009 (JP) .................................. 2009-114279

(51) Int. Cl.
*H03M 1/00* (2006.01)
(52) U.S. Cl.
USPC ............................ 341/141; 341/122; 341/155
(58) Field of Classification Search
USPC .................................. 341/120, 122, 141, 155
See application file for complete search history.

(56) References Cited

U.S. PATENT DOCUMENTS

| 6,407,687 | B2 | 6/2002 | Martin et al. |
| 6,483,448 | B2 | 11/2002 | Martin et al. |
| 7,242,335 | B2 | 7/2007 | Rubin et al. |
| 7,411,533 | B2 * | 8/2008 | Posamentier ................. 341/122 |
| 7,671,779 | B1 * | 3/2010 | Guidry et al. ................. 341/172 |
| 7,705,756 | B2 | 4/2010 | Harper |
| 2008/0106448 | A1 * | 5/2008 | Harper .......................... 341/141 |

FOREIGN PATENT DOCUMENTS

| JP | 8-56160 A | 2/1996 |
| JP | 2004-328913 A | 11/2004 |
| JP | 2006-329682 A | 12/2006 |
| JP | 2007-6512 A | 1/2007 |
| JP | 2007-309773 A | 11/2007 |

OTHER PUBLICATIONS

Japanese Office Action dated May 7, 2013 with a partial English translation.

* cited by examiner

*Primary Examiner* — Khai M Nguyen
(74) *Attorney, Agent, or Firm* — McGinn IP Law Group, PLLC

(57) ABSTRACT

An electric device includes first, second and third selectors. A first node connects to a first input of the first selector, a second node connects to a first input of the second selector, a third node connects to a second input of the first selector, and a fourth node connects to a second input of the second selector. A first switch connects to the first node, and a second switch connects to the second node. A first capacitor connects between the first switch and the third node, and a second capacitor connects between the second switch and the fourth node. A fifth node connects between an output of the first selector and a first input of the third selector, and a sixth node connects between an output of the second selector and a second input of the third selector. An A/D converter connects to an output of the third selector.

10 Claims, 5 Drawing Sheets

A/D CONVERSION CIRCUIT AND TEST METHOD

INCORPORATION BY REFERENCE

This application is a Continuation Application of U.S. patent application Ser. No. 12/662,711, having US filing date of Apr. 29, 2010, now U.S. Pat. No. 8,018,362.

This application is based upon and claims the benefit of priority from Japanese patent application No. 2009-114279, filed on May 11, 2009, the disclosure of which is incorporated herein in its entirety by reference.

BACKGROUND

1. Field of the Invention

The present invention relates to an A/D conversion circuit and a test method.

2. Description of Related Art

In recent years, semiconductor integrated circuits have been mounted on control systems of automobiles, and the semiconductor integrated circuits are required to endure the harsh environment. In accordance with this, it is strongly demanded to test the semiconductor integrated circuits with higher level than before and to enhance the reliability of the semiconductor integrated circuits.

In order to control motors with high output and high performance such as EPS, HEV with high accuracy, it is required to sample currents (U phase, V phase, W phase) flowing in a motor control circuit to perform feedback control.

Japanese Unexamined Patent Application Publication No. 2004-328913 discloses a circuit that holds voltages according to current values of U phase, V phase, W phase by sample hold circuits and transmits each of the sample hold voltages to a control processor. When the sampling cannot be performed appropriately, an error voltage is supplied to the sample hold circuit from an error voltage source (see paragraph 0018 of Japanese Unexamined Patent Application Publication No. 2004-328913).

Japanese Unexamined Patent Application Publication No. 2007-309773 discloses a technique of reducing overhead of a diagnostic circuit when diagnosing a failure of an A/D (Analog/Digital) converter of an analog input section to an LSI or a failure of a multi-input multiplexer and malfunctions such as a break, a power supply short circuit, a ground short circuit in various kinds of sensors on a mother board of an application system. Japanese Unexamined Patent Application Publication No. 2007-309773 shows in FIG. 11 a semiconductor integrated circuit including an impedance converter (OP_Amp0, for example) and a diagnostic circuit (BIDT Cirt0, for example) in each of eight-channel analog input terminal of a multiplexer MPX.

Japanese Unexamined Patent Application Publication No. 2007-6512 discloses a fault detector of an A/D converter. Japanese Unexamined Patent Application Publication No. 2007-6512 discloses a technique of comparing an A/D converted value with an ideal value, and judging that there is a failure in the A/D converter when the difference between the both values exceeds a predetermined value.

Japanese Unexamined Patent Application Publication No. 8-56160 discloses an abnormality detector of an A/D converter. Japanese Unexamined Patent Application Publication No. 8-56160 discloses a technique of selectively supplying a first reference voltage or a second reference voltage to an A/D converter, making comparison between each of the A/D converted values with a predetermined normal output value of the A/D converter, and judging that the A/D converter is abnormal when either of them is unequal.

SUMMARY

As stated above, it is required to sample the currents flowing in the motor control circuit (U phase, V phase, and W phase) in order to control the motor with high accuracy. In this case, it is preferable to provide an S/H (Sample/Hold) circuit for each of input channels. It is preferable that the voltages according to the currents flowing in the motor control circuit (U phase, V phase, W phase) are held in the S/H circuits, and after that, the voltage values that are held are converted to digital values.

In the case above, it is not sufficient to simply execute the operation test of the A/D conversion circuit in order to realize the high-level test, but it is preferable to test the operation of the circuit that is located at the previous stage of the A/D conversion circuit as well. However, it has not been realized to test the retention characteristics of the S/H circuits, and the A/D conversion operation including the previous circuits of the A/D converter such as the operation of peripheral circuits of the S/H circuits.

A first exemplary aspect of the present invention is an A/D conversion circuit including a plurality of transmission paths that transmit signal voltages and reference voltages, and an A/D conversion unit that A/D converts voltages output from the transmission paths, in which each of the plurality of transmission paths includes a first switch that selectively outputs one of the signal voltage and the reference voltage, a hold circuit that holds output voltage from the first switch, and a second switch that selectively outputs one of the output voltage from the first switch and output voltage from the hold circuit. By employing this configuration, it is possible to test the A/D conversion operation including the previous circuits of the A/D conversion unit.

A second exemplary aspect of the present invention is a semiconductor device including the A/D conversion circuit described above, a CPU that instructs the A/D conversion circuit to execute A/D conversion, and a time measurement circuit that measures time based on the instruction from the CPU and instructs the A/D conversion circuit to execute the A/D conversion after completion of measurement of a predetermined time. Hence, sequential voltage retention characteristics of the hold circuits can also be tested.

A third exemplary aspect of the present invention is a test method including A/D converting first reference voltage input through a path while keeping the first reference voltage stored in a hold circuit, the path being arranged to be parallel with the hold circuit, A/D converting second reference voltage input through the path while keeping the hold circuit floated, and canceling floating state of the hold circuit to A/D convert output voltage from the hold circuit. Hence, it is possible to test the A/D conversion operation including the previous circuits of the A/D conversion unit.

According to the present invention, it is possible to test the A/D conversion operation including the previous circuits of the A/D converter.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Hereinafter, the first exemplary embodiment of the present invention will be described with reference to FIGS. 1 to 3.

Figure 1:
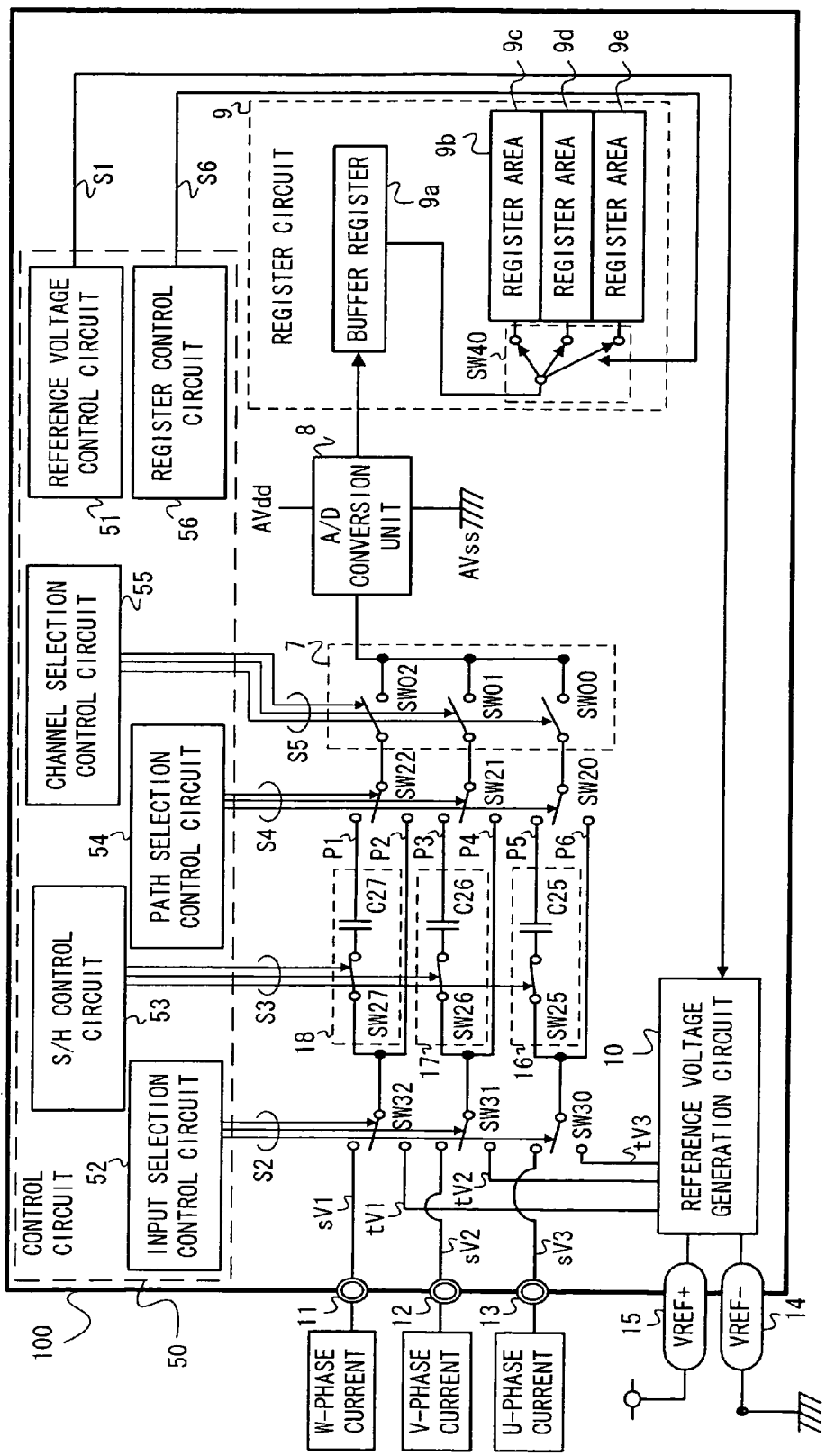
FIG. 1 is a schematic circuit diagram of an A/D conversion circuit according to a first exemplary embodiment of the present invention.

As shown in FIG. 1, an A/D conversion circuit (semiconductor integrated circuit) 100 includes switches SW30 to SW32 (first switch), S/H circuits (hold circuits) 16 to 18, switches SW20 to SW22 (second switch), a multiplexer (selection circuit) 7, an A/D conversion unit 8, a register circuit (digital value hold circuit) 9, a reference voltage generation circuit 10, a control circuit 50, and input terminals 11 to 15. The S/H circuit 16 includes a switch SW (third switch) 25 and a capacitor C25. The S/H circuit 17 includes a switch SW26 and a capacitor C26. The S/H circuit 18 includes a switch SW27 and a capacitor C27. The multiplexer 7 includes switches SW00 to SW02. The register circuit 9 includes a switch SW40, a buffer register 9a, and a Ch register 9b. The Ch register 9b includes register areas 9c, 9d, 9e. The control circuit 50 includes a reference voltage control circuit 51, an input selection control circuit 52, an S/H control circuit 53, a path selection control circuit 54, a channel selection control circuit 55, and a register control circuit 56.

The A/D conversion circuit 100 converts voltage values input to the input terminals 11 to 13 to digital values and holds the digital values. W-phase current is input as a voltage value, V-phase current is input as a voltage value, and U-phase current is input as a voltage value from a motor control circuit to the A/D conversion circuit 100. The A/D conversion circuit 100 holds the input voltages by the S/H circuits 16 to 18 at the same timing, sequentially outputs the voltages held in the S/H circuits 16 to 18 to the A/D conversion unit 8, sequentially converts the output voltages from the S/H circuits 16 to 18 to the digital values, and holds the digital values that are converted in a certain area of the register circuit 9.

When the A/D conversion circuit 100 that is operated as above in a normal operation is tested, it is desirable that the whole A/D conversion operation including the operations of the previous circuits of the A/D conversion unit 8 (especially, S/H circuits 16 to 18) are tested rather than testing only the A/D conversion operation of the A/D conversion unit 8. In view of this point, in the first exemplary embodiment, bypasses are arranged in parallel with the S/H circuits 16 to 18, and the outputs of the S/H circuits 16 to 18 and the outputs of the bypasses can be selected by the subsequent switches SW20 to SW22. Thus, the A/D conversion operation including the previous circuits of the A/D conversion unit 8 (especially, S/H circuits 16 to 18) can be tested. This point will be described hereinafter in detail.

The connection relation will be described first. As shown in FIG. 1, the input terminal 11 is connected to a first input terminal of the switch SW32. A first output terminal of the reference voltage generation circuit 10 is connected to a second input terminal of the switch SW32. The input terminal 12 is connected to a first input terminal of the switch SW31. A second output terminal of the reference voltage generation circuit 10 is connected to a second input terminal of the switch SW31. The input terminal 13 is connected to a first input terminal of the switch SW30. A third output terminal of the reference voltage generation circuit 10 is connected to a second input terminal of the switch SW30. A signal voltage sV1 is supplied to the first input terminal of the switch SW32 through the input terminal 11. A signal voltage sV2 is supplied to the first input terminal of the switch SW31 through the input terminal 12. A signal voltage sV3 is supplied to the first input terminal of the switch SW30 through the input terminal 13. A reference voltage tV1 is supplied from the reference voltage generation circuit 10 to the second input terminal of the switch SW32. A reference voltage tV2 is supplied from the reference voltage generation circuit 10 to the second input terminal of the switch SW31. A reference voltage tV3 is supplied from the reference voltage generation circuit 10 to the second input terminal of the switch SW30. Note that the reference voltages may be called test voltages and the reference voltage generation circuit 10 may be called test voltage generation circuit.

An output terminal of the switch SW32 is connected to an input terminal of the switch SW27. An output terminal of the switch SW31 is connected to an input terminal of the switch SW26. An output terminal of the switch SW30 is connected to an input terminal of the switch SW25.

Similarly, the output terminal of the switch SW32 is connected to a second input terminal of the switch SW22. The output terminal of the switch SW31 is connected to a second input terminal of the switch SW21. The output terminal of the switch SW30 is connected to a second input terminal of the switch SW20.

An output terminal of the switch SW27 is connected to a first terminal of the capacitor C27. An output terminal of the switch SW26 is connected to a first terminal of the capacitor C26. An output terminal of the switch SW25 is connected to a first terminal of the capacitor C25.

A second terminal of the capacitor C27 is connected to a first input terminal of the switch SW22. A second terminal of the capacitor C26 is connected to a first input terminal of the switch SW21. A second terminal of the capacitor C25 is connected to a first input terminal of the switch SW20.

A transmission path between the output terminal of the switch SW30 and the second input terminal of the switch SW20 is called path P6. Similarly, a transmission path between the output terminal of the switch SW30 and the first input terminal of the switch SW20 is called path P5. Similarly, transmission paths P4 and P3 are provided between the switch SW31 and the switch SW21. Transmission paths P2 and P1 are provided between the switch SW32 and the switch SW22.

An output terminal of the switch SW22 is connected to an input terminal of the switch SW02. An output terminal of the switch SW21 is connected to an input terminal of the switch SW01. An output terminal of the switch SW20 is connected to an input terminal of the switch SW00.

Output terminals of the switches SW00 to SW02 are connected to an input terminal of the A/D conversion unit 8. An output terminal of the A/D conversion unit 8 is connected to an input terminal of the buffer register 9a. An output terminal of the buffer register 9a is connected to an input terminal of the switch SW40. A first output terminal of the switch SW40 is connected to an input terminal of the register area 9c. A second output terminal of the switch SW40 is connected to an input terminal of the register area 9d. A third output terminal of the switch SW40 is connected to an input terminal of the register area 9e.

The input terminal 14 is connected to a first input terminal of the reference voltage generation circuit 10. The input terminal 15 is connected to a second input terminal of the reference voltage generation circuit 10. A reference voltage VREF− is supplied to the reference voltage generation circuit 10 through the input terminal 14. A reference voltage VREF+ is supplied to the reference voltage generation circuit 10 through the input terminal 15. Note that the input terminal 14 is connected to ground. The input terminal 15 is connected to a power supply potential.

An output terminal of the reference voltage control circuit 51 is connected to a control terminal of the reference voltage generation circuit 10. An output terminal of the input selection control circuit 52 is connected to select terminals of the switches SW30 to SW32. An output terminal of the S/H control circuit 53 is connected to control terminals of the switches SW25 to SW27. An output terminal of the path selection control circuit 54 is connected to select terminals of the switches SW20 to SW22. An output terminal of the channel selection control circuit 55 is connected to control terminals of the switches SW00 to SW02. An output terminal of the register control circuit 56 is connected to a select terminal of the switch SW40.

Next, the operation of each circuit element will be described with reference to FIG. 1.

The switch SW30 selectively connects the first input terminal or the second input terminal to the output terminal according to a select signal S2 transmitted from the input selection control circuit 52. In other words, the switch SW30 selectively outputs the signal voltage sV3 or the reference voltage tV3 according to the select signal S2.

The operation of the switch SW31 is equal to that of the switch SW30. However, the signal voltage sV3 is replaced with the signal voltage sV2, and the reference voltage tV3 is replaced with the reference voltage tV2. The operation of the switch SW32 is equal to that of the switch SW30. However, the signal voltage sV3 is replaced with the signal voltage sV1, and the reference voltage tV3 is replaced with the reference voltage tV1.

The switch SW25 is turned on or off according to a control signal S3 transmitted from the S/H control circuit 53. In other words, the switch SW25 connects the output terminal of the switch SW30 to the first terminal of the capacitor C25 according to the control signal S3 transmitted from the S/H control circuit 53.

The operation of the switch SW26 is equal to that of the switch SW25. However, the switch SW30 is replaced with the switch SW31, and the capacitor C25 is replaced with the capacitor C26. The operation of the switch SW27 is equal to that of the switch SW25. However, the switch SW30 is replaced with the switch SW32, and the capacitor C25 is replaced with the capacitor C27.

The switch SW20 selectively connects the first input terminal or the second input terminal to the output terminal according to a select signal S4 transmitted from the path selection control circuit 54. In other words, the switch SW20 selectively connects the path P5 or the path P6 to the switch SW00 according to the select signal S4.

The operation of the switch SW21 is equal to that of the switch SW20. However, the paths P5 and P6 are replaced with the paths P3 and P4. The operation of the switch SW22 is equal to that of the switch SW20. However, the paths P5 and P6 are replaced with the paths P1 and P2.

The switch SW00 is turned on or off according to a control signal S5 transmitted from the channel selection control circuit 55. In other words, the switch SW00 connects the output terminal of the switch SW20 to the input terminal of the A/D conversion unit 8 according to the control signal S5.

The operation of the switch SW01 is equal to that of the switch SW00. However, the switch SW20 is replaced with the switch SW21. The operation of the switch SW02 is equal to that of the switch SW00. However, the switch SW20 is replaced with the switch SW22.

The A/D conversion unit 8 converts the input voltage values to the digital values and outputs the digital values. A ground potential AVss and a power supply potential AVdd are supplied to the A/D conversion unit 8. The A/D conversion unit 8 may have any circuit configuration. The buffer register 9a is a typical register that temporarily holds the outputs of the A/D conversion unit 8. The switch SW40 transmits the digital values output from the buffer register 9a to a certain register area of the Ch register 9b according to a select signal S6 transmitted from the register control circuit 56. The Ch register 9b is formed by register areas 9c to 9e, each of which holding a digital value. The register areas 9c to 9e hold digital values transmitted from the buffer register 9a through the switch SW40.

The reference voltage generation circuit 10 generates the reference voltages used for the test based on the reference voltage VREF− and the reference voltage VREF+. The operation state of the reference voltage generation circuit 10 is determined by a control signal S1 transmitted from the reference voltage control circuit 51. The reference voltage generation circuit 10 outputs the reference voltage of the voltage value determined by the control signal S1 from the output terminal. The reference voltage generation circuit 10 may have any circuit configuration.

The reference voltage control circuit 51 controls the operation state of the reference voltage generation circuit 10 based on the control signal S1. The input selection control circuit 52 controls the selection state of the switches SW30 to SW32 based on the select signal S2. The S/H control circuit 53 controls the ON/OFF state (operation state) of the switches SW25 to SW27 based on the control signal S3. The path selection control circuit 54 controls the selection state of the switches SW20 to SW22 based on the select signal S4. The channel selection control circuit 55 controls the ON/OFF state of the switches SW00 to SW02 based on the control signal S5. The register control circuit 56 controls the selection state of the switch SW40 based on the select signal S6. Note that the control circuit 50 may be realized by wired logic, or may be realized with CPU control by software.

Referring next to FIGS. 2A to 2D, the operation of the A/D conversion circuit 100 in the test operation will be described. In this example, only the transmission path that transmits the voltage value according to the U-phase current will be described. The same description will be applied to the transmission paths that transmit the voltage values according to the V-phase current and the W-phase current. The voltage level of the reference voltage output from the reference voltage generation circuit 10 is predetermined according to the control signal S1.

Figure 2A:
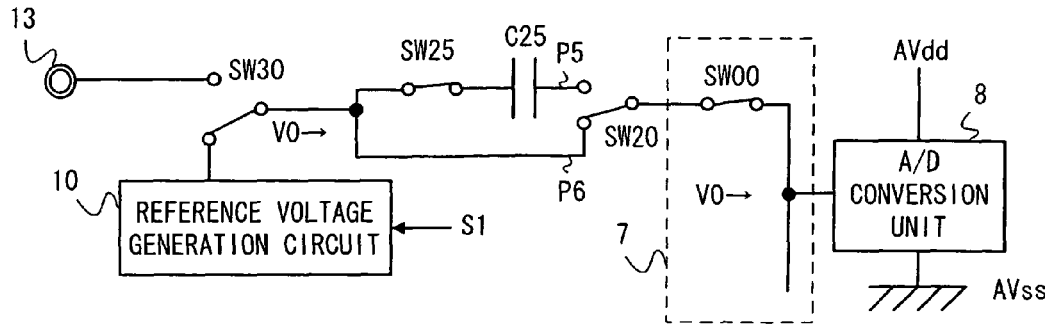
FIGS. 2A to 2D are explanatory diagrams describing the operation of the A/D conversion circuit according to the first exemplary embodiment of the present invention.

As shown in FIG. 2A, the switch SW30 connects the reference voltage generation circuit 10 to the switch SW20 according to the select signal S2 output from the input selection control circuit 52 (at this time, the second input terminal of the switch SW30 is connected to the output terminal of the switch SW30). The switch SW25 is turned on according to the control signal S3 from the S/H control circuit 53 (at this time, the input terminal and the output terminal of the switch SW25 short out). The switch SW20 connects the path P6 to the switch SW00 according to the select signal S4 output from the path selection control circuit 54 (at this time, the second input terminal of the switch SW20 is connected to the output terminal of the switch SW20). In the multiplexer 7, the switch SW00 is ON according to the control signal S5 output from the channel selection control circuit 55 (at this time, the output terminal and the input terminal of the switch SW00 short out).

In FIG. 2A, the reference voltage generation circuit 10 supplies the reference voltage of V 0 defined according to the control signal S1 to the capacitor C25 through the switch SW30 and the switch SW25. Further, the reference voltage generation circuit 10 supplies the reference voltage to the A/D conversion unit 8 through the switch SW30, the switch SW20, and the switch SW00.

Figure 2B:
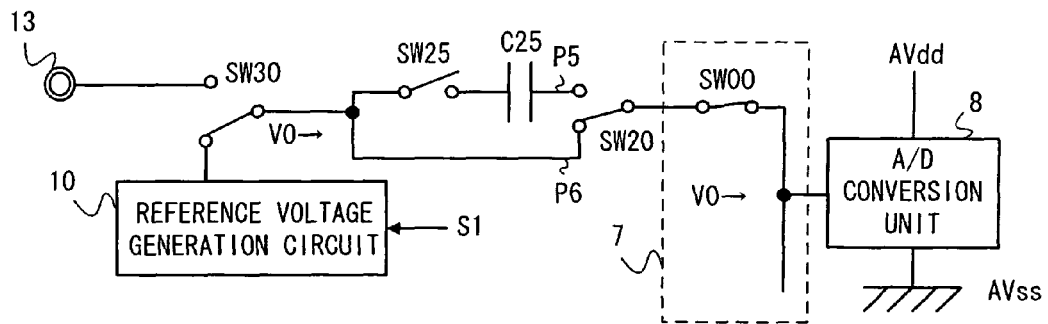

In FIG. 2B, the switch SW25 is turned off according to the control signal S3 output from the S/H control circuit 53. However, when the state transits from FIG. 2A to FIG. 2B, sampling time is secured that is sufficient for the reference voltage output from the reference voltage generation circuit 10 to be sufficiently held in the capacitor C25.

When the state transits from FIG. 2A to FIG. 2B, the A/D conversion unit 8 converts the reference voltage supplied from the reference voltage generation circuit 10 to the digital value. Note that any method may be possible to control the timing to start the A/D conversion by the A/D conversion unit 8. The digital value output from the A/D conversion unit 8 is temporarily stored in the buffer register 9a. After that, the switch SW40 supplies the digital value output from the buffer register 9a to the register area 9e according to the select signal S6 output from the register control circuit 56.

In this way, the reference voltage V 0 output from the reference voltage generation circuit 10 is A/D converted by the A/D conversion unit 8, and thereafter it is transmitted to the register area 9e through the buffer register 9a and the switch SW40 and stored in the register area 9e. Then, it is judged whether the digital value held in the register area 9e matches the expectation value by the comparison processing by a CPU (not shown) or the like. When the value held in the register area 9e is different from the expectation value, the failure of the A/D conversion circuit 100 is detected. By the test processes shown in FIGS. 2A and 2B, the test of the path that does not employ the S/H circuit 16 is completed.

Figure 2C:
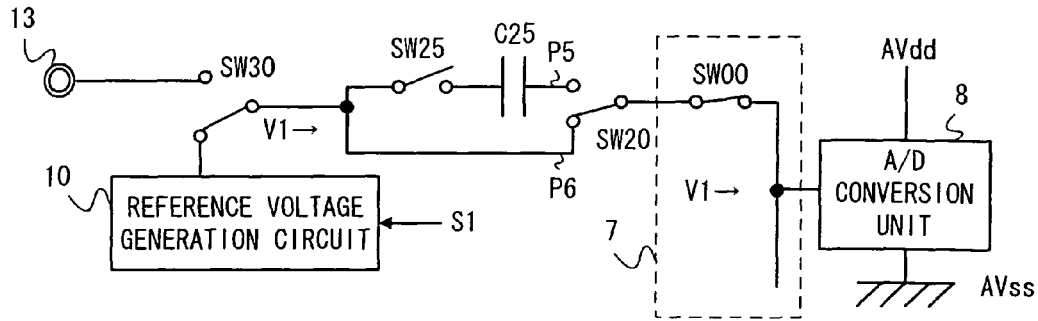

When there is no failure in the A/D conversion circuit 100 as a result of the test, the A/D conversion circuit 100 transits to the state as shown in FIG. 2C.

In FIG. 2C, the reference voltage generation circuit 10 outputs the reference voltage of V 1 according to the change of the signal value of the control signal S1 output from the reference voltage control circuit 51. With this state, as already stated above with reference to FIG. 2B, the A/D conversion unit 8 converts the reference voltage of V 1 to the digital value. Then, the digital value output from the A/D conversion unit 8 is held in the register area 9e. Then, as already stated above with reference to FIG. 2B, it is judged whether the value held in the register area 9e matches the expectation value, so as to judge whether there is a failure in the A/D conversion circuit 100 or not.

Figure 2D:
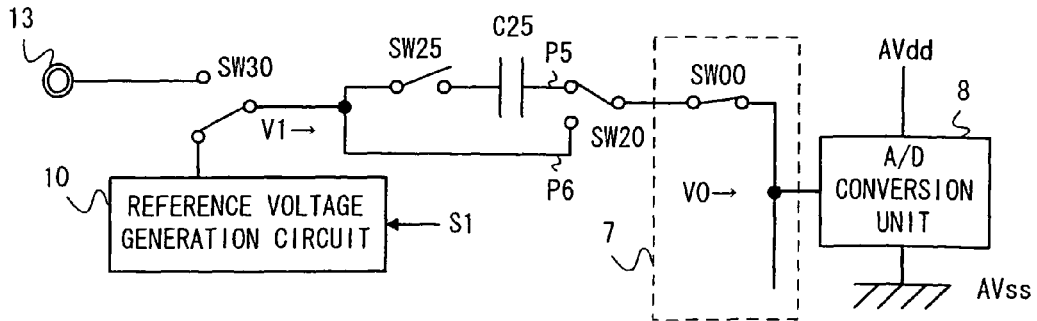

When it is judged that the A/D conversion circuit 100 is a non-defective product as a result of the test shown in FIG. 2C, the A/D conversion circuit 100 transits to the state shown in FIG. 2D.

In FIG. 2D, the switch SW20 connects the path P5 to the switch SW00 according to the select signal S4 output from the path selection control circuit 54. The A/D conversion unit 8 converts the holding voltage supplied from the capacitor C25 to the digital value. In the same way as above, the digital value that is generated in the A/D conversion unit 8 is held in the register area 9e. Based on the comparison of the value held in the register area 9e with the expectation value, it is judged whether there is a failure in the A/D conversion circuit 100, as already stated above. By performing the processing shown in FIG. 2D, it is judged whether there is a failure in the path that is selected this time (more specifically, the line between the switch SW30 and the switch SW25, the switch SW25, the capacitor C25, the line between the switch SW25 and the capacitor C25, and the line between the capacitor C25 and the switch SW20).

Figure 3:
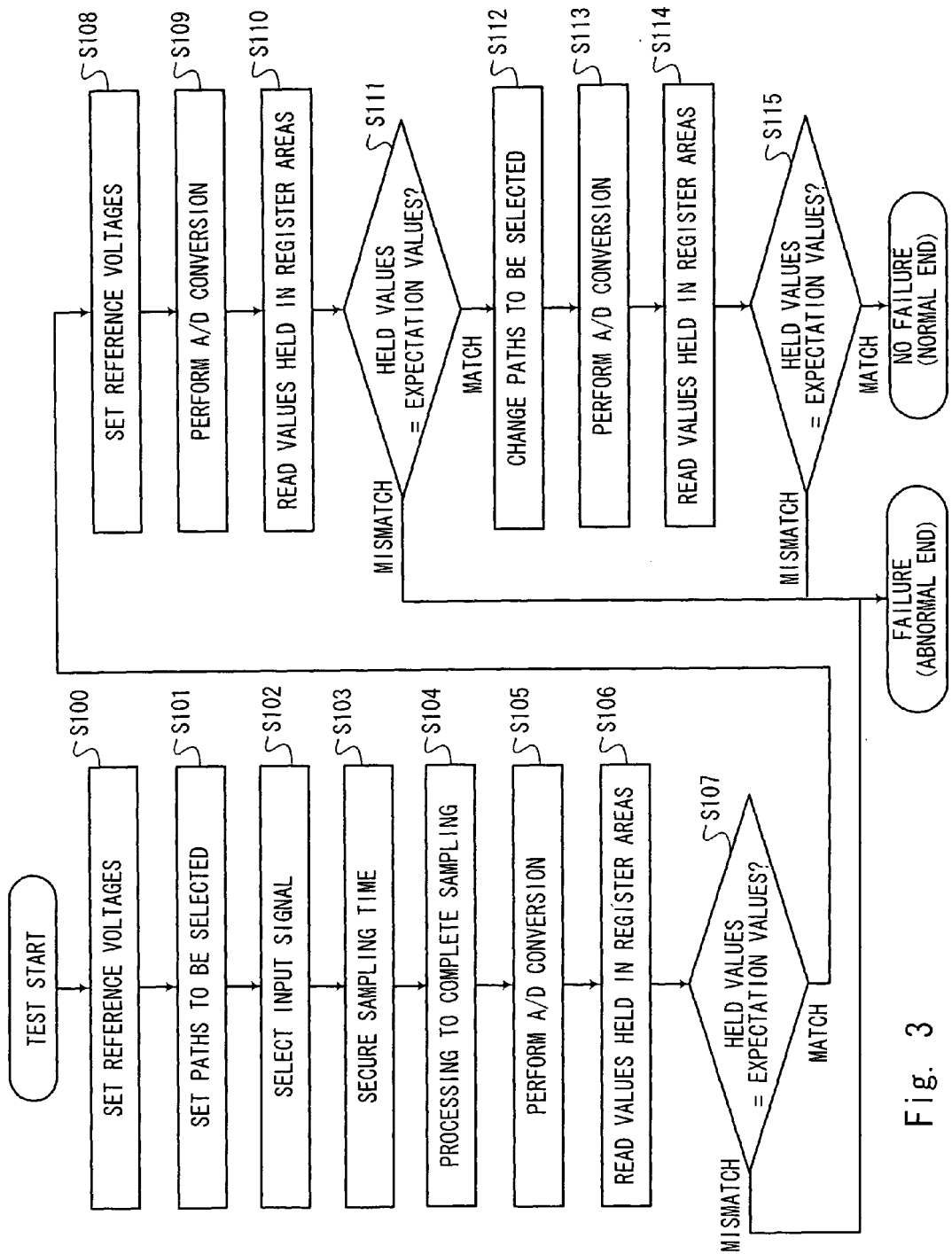
FIG. 3 is a schematic flow chart for describing the operation of the A/D conversion circuit according to the first exemplary embodiment of the present invention.

Referring next to FIG. 3, the test of the A/D conversion circuit 100 will be described with reference to a flow chart. In the first exemplary embodiment, the processing described with reference to FIGS. 2A to 2D is carried out in parallel in accordance with each of the S/H circuits 16 to 18.

First, the reference voltages are set (S100). More specifically, the reference voltage control circuit 51 generates the control signal S1, and supplies the generated control signal S1 to the reference voltage generation circuit 10. The reference voltage generation circuit 10 generates the reference voltages according to the control signal S1 supplied from the reference voltage control circuit 51, and supplies the reference voltages to the switches SW30 to SW32. More specifically, the reference voltage generation circuit 10 supplies the reference voltage of V 0 to the switch SW30, supplies the reference voltage of V 1 to the switch SW31, and supplies the reference voltage of V 2 to the switch SW32. Note that the values of the reference voltages supplied to the switches SW30 to SW32 are different with each other.

Next, the paths to be selected are set (S101). More specifically, the path selection control circuit 54 generates the select signal S4, and supplies the generated select signal S4 to the switches SW20 to SW22. The switch SW20 selects the path P6 that does not include the S/H circuit 16 according to the select signal S4 transmitted from the path selection control circuit 54, and connects the path P6 that is selected to the switch 00. Other switches SW21 and SW22 are operated in the similar way as the switch SW20. The switch SW21 connects the path P4 to the switch SW01. The switch SW22 connects the path P2 to the switch SW02.

Next, the selection processing of the input signal is executed (S102). More specifically, the input selection control circuit 52 generates the select signal S2, and supplies the generated select signal S2 to the switches SW30 to SW32. The switches SW30 to SW32 select the outputs of the reference voltage generation circuit 10 as inputs according to the select signal S2.

Next, the sampling time is secured (S103). More specifically, time that is sufficient to hold the reference voltages supplied from the reference voltage generation circuit 10 in the capacitors C25 to C27 is secured. Before the sampling period, the switches SW25 to SW27 are ON according to the control signal S3 supplied from the S/H control circuit 53.

Next, processing for completing the sampling is carried out (S104). More specifically, the S/H control circuit 53 generates the control signal S3, and supplies the generated control signal S3 to the switches SW25 to SW27. The switches SW25 to SW27 are turned off according to the control signal S3. In this way, the sampling of the reference voltages by the capacitors C25 to C27 is completed. In this example, each of the capacitors C25 to C27 properly holds the reference voltages supplied from the reference voltage generation circuit 10.

Subsequently, the A/D conversion is executed (S105). More specifically, the multiplexer 7 sequentially selects three reference voltages supplied from the reference voltage generation circuit 10 according to the control signal S5 supplied from the channel selection control circuit 55, and supplies the voltages to the A/D conversion unit 8. The A/D conversion unit 8 converts the reference voltages that are sequentially supplied from the multiplexer 7 to the digital values.

The operation of the multiplexer 7 may be described as follows. The multiplexer 7 selects channels that are between the switches SW30 to SW32 and the multiplexer 7 according to the control signal S5, and connects the channels that are selected to the A/D conversion unit 8. The path between the output terminal of the switch SW30 and the input terminal of the switch SW00 is called channel 0. The path between the output terminal of the switch SW31 and the input terminal of the switch SW01 is called channel 1. The path between the output terminal of the switch SW32 to the input terminal of the switch SW02 is called channel 2. At this time, the multiplexer 7 sequentially selects the channel 0 to the channel 2, and connects the channels to the A/D conversion unit 8. The A/D conversion unit 8 sequentially converts the reference voltages supplied through the channels selected by the multiplexer 7 to the digital values.

Note that the digital values that are sequentially output from the A/D conversion unit 8 are held in the register areas 9c to 9e corresponding to each channel. More specifically, the digital value corresponding to the channel 0 is transmitted from the A/D conversion unit 8 to the buffer register 9a. The switch SW40 connects the output terminal of the buffer register 9a to the input terminal of the register area 9e according to the select signal S6. In this way, the digital value that is held in the buffer register 9a is transferred to the register area 9e. The digital value corresponding to the channel 1 is held in the register area 9d by the similar method as stated above. The digital value corresponding to the channel 2 is held in the register area 9c by the similar method as stated above.

Next, the values held in the register areas 9c to 9e are read out (S106). For example, the CPU reads the digital values from the register areas 9c to 9e.

Next, it is judged whether the held values match the expectation values (S107). For example, the CPU judges whether each of the digital values read out from the register areas 9c to 9e matches each of the expectation values. When at least one of the held values is different from the expectation value, the A/D conversion circuit 100 is judged as the defective product. In this way, the failure of the A/D conversion circuit 100 is detected, and thus the test process is completed.

When all of the held values match the expectation values in step S107, the reference voltages are set (S108). More specifically, the processing that is equal to the step S100 is carried out. Note that, it is assumed here that the reference voltage generation circuit 10 supplies the reference voltage V1 to the switch SW30, supplies the reference voltage V2 to the switch SW31, and supplies the reference voltage V0 to the switch SW32.

Next, the A/D conversion is carried out (S109). More specifically, the A/D conversion is carried out by the method similar to the step S105 stated above.

Then, the values held in the register areas are read out (S110). More specifically, the processing similar to the step S106 stated above is carried out.

Next, it is judged whether the held values are equal to the expectation values (S110). More specifically, the processing that is similar to the step S107 is performed. When at least one of the held values is different from the expectation value, the A/D conversion circuit 100 is judged as a defective product.

When all of the held values match the expectation values as a result of judgment in step S111, the paths to be selected are changed (S112). More specifically, the path selection control circuit 54 generates the select signal S4, and supplies the generated select signal S4 to the switches SW20 to SW22. The switch SW20 connects the path P5 including the S/H circuit 16 to the switch SW00 according to the select signal S4. The operation of the switch SW21 is similar to that of the switch SW20. However, the S/H circuit 16 is replaced with the S/H circuit 17, the path P5 is replaced with the path P3, and the switch SW00 is replaced with the switch SW01. The operation of the switch SW22 is similar to that of the switch SW20. However, the S/H circuit 16 is replaced with the S/H circuit 18, the path P5 is replaced with the path P1, and the switch SW00 is replaced with the switch SW02.

Then, the A/D conversion is executed (S113). More specifically, the processing that is equal to the step S105 is carried out.

Next, the values held in the register areas are read out (S114). More specifically, the processing that is equal to the step S106 is carried out.

Next, it is judged whether the held values match the expectation values (S115). More specifically, the processing that is equal to the step S107 is carried out. When at least one of the held values is different from the expectation value, the A/D conversion circuit 100 is judged as the defective product. When all of the held values match the expectation values, the A/D conversion circuit 100 is judged as the non-defective product. In this way, the failure of the A/D conversion circuit 100 is detected, and this test process is thus completed.

As will be clear from the description above, in the first exemplary embodiment, the input voltages are sampled at the same timing by connecting the S/H circuits 16 to 18 between the A/D conversion unit 8 and the input terminals 11 to 13. By sequentially supplying the outputs of the S/H circuits 16 to 18 to the A/D conversion unit 8 by selection operation by the multiplexer 7, it is possible to convert the voltage values obtained at the same timing to the digital values without increasing the size of the circuit.

In order to test the A/D conversion circuit 100 with high accuracy, it is not sufficient to simply perform the operation test of the A/D conversion unit 8. In view of this point, in the first exemplary embodiment, the bypasses are provided in parallel with the S/H circuits 16 to 18, and the outputs of the S/H circuits 16 to 18 and the outputs of the bypasses can be selected by the subsequent switches SW20 to SW22. Hence, the A/D conversion operation can be tested including the previous circuits of the A/D conversion unit 8 (especially, S/H circuits 16 to 18). More specifically, the operation of the switch that is located at the previous stage of the A/D conversion unit 8, the retention characteristics of the S/H circuits 16 to 18, presence or absence of leak of the capacitors C25 to C27 can be tested.

Further, in the first exemplary embodiment, after the reference voltages are stored in the capacitors C25 to C27, the switches SW25 to SW27 are turned off and the capacitors C25 to C27 are floated (see FIG. 2C). While the capacitors C25 to C27 are floated, the A/D conversion operation of the reference voltage having a value that is different from the reference voltages held in the capacitors C25 to C27 is tested. Accordingly, it is possible to test the retention characteristics of the capacitors C25 to C27 without impairing the test efficiency.

Further, in the first exemplary embodiment, the A/D conversion operation can be tested by supplying different reference voltages to each channel. Accordingly, the A/D conversion operation can be tested with high accuracy.

Furthermore, in the first exemplary embodiment, the reference voltages are held in the S/H circuits 16 to 18 in the overlapping period, whereby it is possible to suppress increase of the test time according to the increase of the number of channels. Further, in the first exemplary embodiment, the A/D conversion unit 8 is commonly used among a plurality of channels by employing the multiplexer 7. Accordingly, it is possible to prevent increase of the size of the circuit of the A/D conversion circuit 100, and further suppress occurrence of the failure in the A/D conversion circuit 100 due to the failure of the A/D conversion unit 8.

Further, in the first exemplary embodiment, the plurality of register areas are provided according to each channel. Hence, the failed section of the A/D conversion circuit 100 can be specified based on the comparison between the held values and the expectation values of the register areas. Hence, the yield may be enhanced.

Second Exemplary Embodiment

Figure 4:
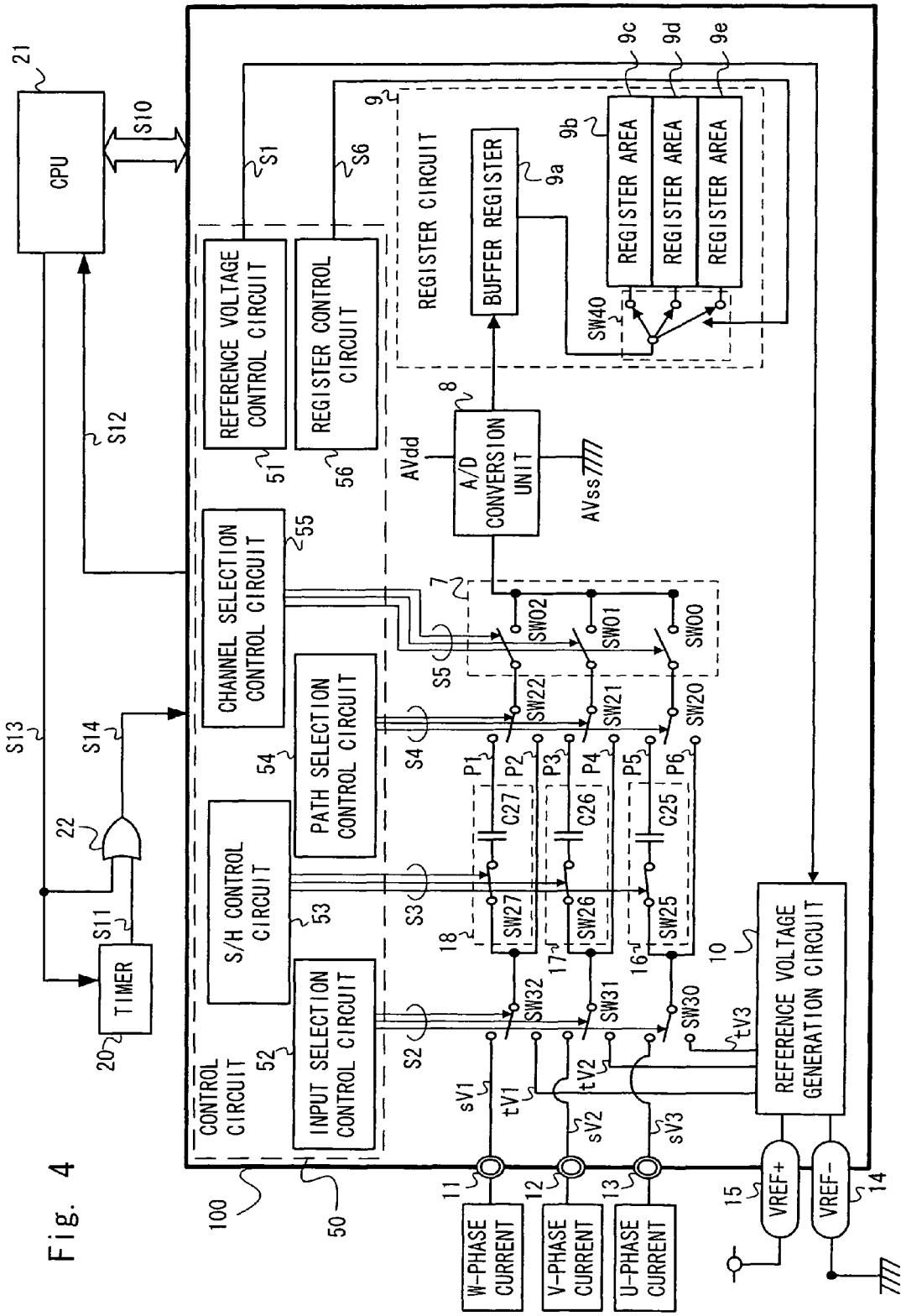
FIG. 4 is a schematic circuit diagram of an A/D conversion circuit according to a second exemplary embodiment of the present invention.
Figure 5:
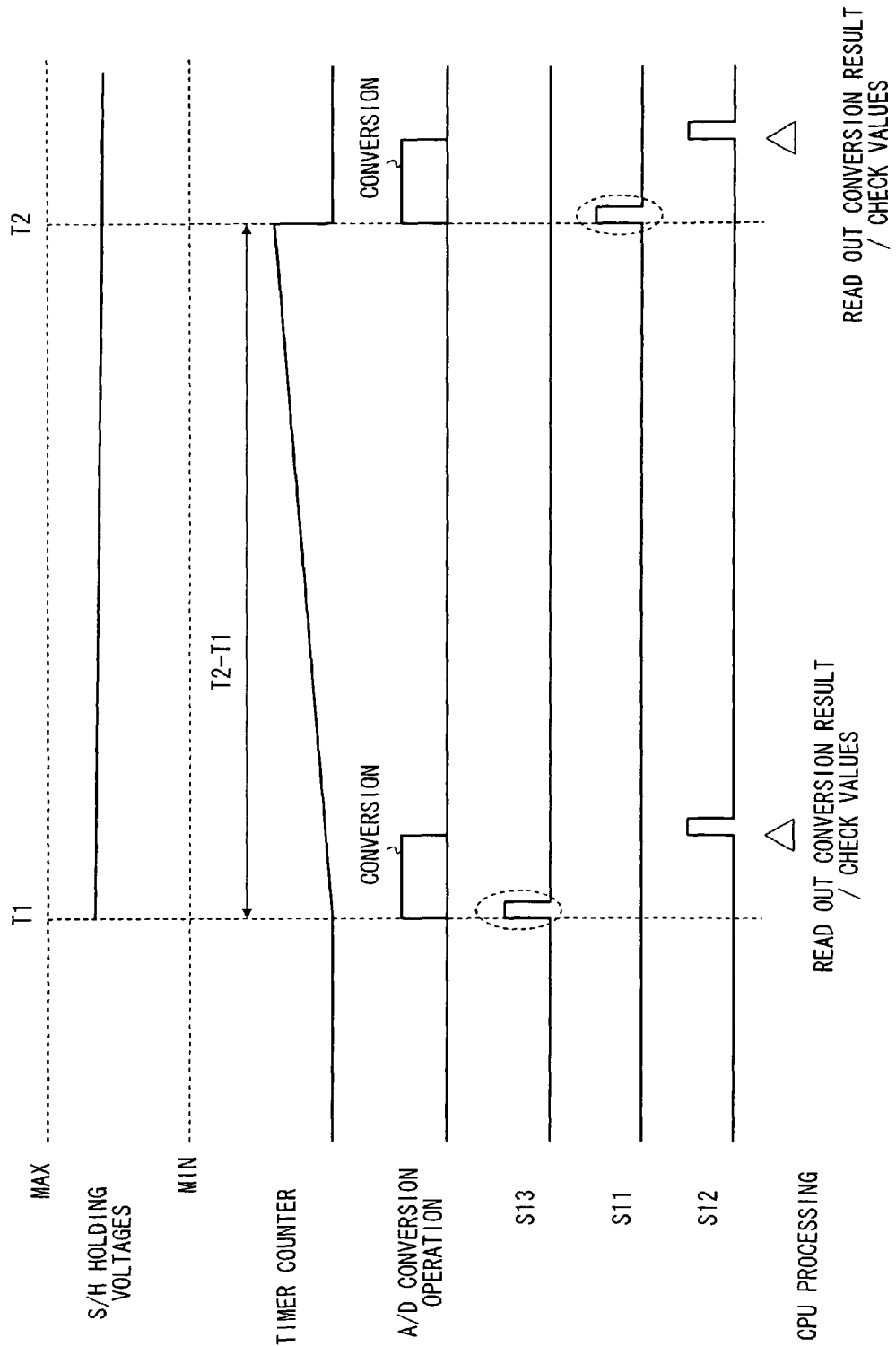
FIG. 5 is a schematic timing chart to describe the operation of the A/D conversion circuit according to the second exemplary embodiment of the present invention.

Referring next to FIGS. 4 and 5, the second exemplary embodiment of the present invention will be described.

As shown in FIG. 4, a CPU 21 is connected to the A/D conversion circuit 100 through a bus. Further, a timer (time measurement circuit) 20 and an AND circuit (logic circuit) 22 are connected to an output terminal of the CPU 21. An output of the CPU 21 is connected to a first input terminal of the AND circuit 22. An output terminal of the timer 20 is connected to a second input terminal of the AND circuit 22. An output terminal of the AND circuit 22 is connected to the A/D conversion circuit 100. An output terminal of the A/D conversion circuit 100 is connected to an input terminal of the CPU 21.

In the second exemplary embodiment, the A/D conversion is carried out at a timing at which the timer 20 completes time measurement. Thus, sequential retention characteristics of the capacitors C25 to C27 included in the S/H circuits 16 to 18 can be tested. Accordingly, the A/D conversion circuit 100 can be tested with higher accuracy compared with the first exemplary embodiment.

Hereinafter, the circuit elements that are added will be described with reference to FIG. 4, and the test process of the sequential retention characteristics of the S/H circuits will be described with reference to FIG. 5.

The CPU 21 is a central processing unit that controls function circuits such as the timer 20 and the A/D conversion circuit 100. The CPU 21 instructs the A/D conversion circuit 100 to execute the A/D conversion through a bus. The A/D conversion unit 8 included in the A/D conversion circuit 100 executes the A/D conversion according to the instruction by the CPU 21. Further, the CPU 21 controls activation of the timer 20. The CPU 21 generates a measurement instruction signal S13, and outputs the measurement instruction signal S13 to the timer 20.

The timer 20 is a function circuit that is able to measure the time that is set. The timer 20 starts time measurement according to the measurement instruction signal S13 transmitted from the CPU 21. Upon completion of the time measurement that is set, the timer 20 outputs an interruption signal S11 to the AND circuit 22.

The AND circuit 22 is a typical logical AND circuit, and generates an A/D conversion start signal S14 according to the inputs of the measurement instruction signal S13 and the interruption signal S11. The A/D conversion start signal S14 that is output from the AND circuit 22 is transmitted to the A/D conversion circuit 100. The A/D conversion circuit 100 starts the A/D conversion according to the A/D conversion start signal S14 output from the AND circuit 22.

After executing the A/D conversion, the A/D conversion circuit 100 outputs an A/D conversion completion signal S12 to the CPU 21.

Referring next to FIG. 5, the test of the sequential retention characteristics of the S/H circuits will be described. At time T1, the A/D conversion circuit 100 is as shown in FIG. 2D.

At time T1, the CPU 21 generates the measurement instruction signal S13, and supplies it to the timer 20. The timer 20 starts time measurement according to the measurement instruction signal S13. At the same time, the CPU 21 instructs the A/D conversion circuit 100 to execute the A/D conversion through the bus. The A/D conversion circuit 100 executes the A/D conversion according to the command by the CPU 21. After executing the A/D conversion, the A/D conversion circuit 100 outputs the A/D conversion completion signal S12 to the CPU 21. The CPU 21 reads the values held in the register areas 9c to 9e according to the A/D conversion completion signal S12, compares the digital values that are read out with the expectation values, and judges the presence or absence of the failure in the A/D conversion circuit 100.

At time T2, the timer 20 outputs the interruption signal S11 according to the completion of measurement of the predetermined time. In accordance with this, the AND circuit 22 outputs the A/D conversion start signal S14 to the A/D conversion circuit 100. The A/D conversion circuit 100 executes A/D conversion according to the A/D conversion start signal S14. Then, as stated above, the A/D conversion circuit 100 outputs the A/D conversion completion signal S12 to the CPU 21 after the A/D conversion. The following processing is the same as that stated above.

In the second exemplary embodiment, the voltage values held in the S/H circuits 16 to 18 are A/D converted again by delaying the timing by the time measured by the timer 20, and it is judged whether the digital values generated by the A/D conversion match the expectation values. Hence, even after a predetermined time has passed, it is possible to judge whether the S/H circuits 16 to 18 are able to keep the certain voltage values. In this way, the A/D conversion circuit 100 can be tested with higher accuracy compared with the first exemplary embodiment. For example, it is possible to test whether the S/H circuits are able to hold the voltages until the maximum holding time that is ensured. Instead of judging whether the digital values completely match the expectation values, it may be judged whether the digital values are within acceptable ranges with respect to the expectation values.

While the invention has been described in terms of several exemplary embodiments, those skilled in the art will recognize that the invention can be practiced with various modifications within the spirit and scope of the appended claims and the invention is not limited to the examples described above. The function of the circuit stated above may be embodied by program control made by the CPU. The number of channels may be any number. The A/D conversion circuit may be applied to any purpose. The S/H circuit may have any circuit configuration.

Further, the scope of the claims is not limited by the exemplary embodiments described above.

Furthermore, it is noted that, Applicant's intent is to encompass equivalents of all claim elements, even if amended later during prosecution.

What is claimed is:

1. An electric device, comprising:
   first, second and third selectors;
   a first node that is coupled to a first input of the first selector;

a second node that is coupled to a first input of the second selector;

a third node that is coupled to a second input of the first selector;

a fourth node that is coupled to a second input of the second selector;

a first switch that is coupled to the first node;

a second switch that is coupled to the second node;

a first capacitor that is coupled between the first switch and the third node;

a second capacitor that is coupled between the second switch and the fourth node;

a fifth node that is coupled between an output of the first selector and a first input of the third selector;

a sixth node that is coupled between an output of the second selector and a second input of the third selector; and an analog/digital (A/D) converter that is coupled to an output of the third selector.

2. The electric device according to claim 1, wherein a pass between the first node and the first input of the first selector comprises a bypass of the first switch and the first capacitor, and wherein a pass between the second node and the first input of the second selector comprises a bypass of the second switch and the second capacitor.

3. The electric device according to claim 1, further comprising:

fourth and fifth selectors;

a first terminal that is coupled to a first input of the fourth selector;

a second terminal that is coupled to a first input of the fifth selector; and a reference voltage generator that is coupled to a second input of the fourth selector and a second input of the fifth selector, wherein the first node is coupled to an output of the fourth selector, and wherein the second node is coupled to an output of the fifth selector.

4. The electric device according to claim 3, wherein each of the fourth and fifth selectors is supplied with a first reference voltage and a second reference voltage different from the first reference voltage by the reference voltage generator.

5. The electric device according to claim 4, further comprising:

a reference voltage controller that generates a signal, wherein the reference voltage generator generates the first and second reference voltages in response to the signal.

6. The electric device according to claim 1, further comprising:

an input selection controller that generates first and second signals, wherein the fourth selector switches, in response to the first signal, a connection configuration where the first node is coupled to the first terminal to a connection configuration where the first node is coupled to the reference voltage generator, and wherein the fifth selector switches, in response to the second signal, a connection configuration where the second node is coupled to the second terminal to a connection configuration where the second node is coupled to the reference voltage generator.

7. The electric device according to claim 1, further comprising:

a switch controller that generates first and second signals, wherein the first switch switches, in response to the first signal, a connection configuration where the first node is coupled to the first capacitor to a connection configuration where the first node is not coupled to the first capacitor, and wherein the second switch switches, in response to the second signal, a connection configuration where the second node is coupled to the second capacitor to a connection configuration where the second node is not coupled to the second capacitor.

8. The electric device according to claim 1, further comprising:

a path selection controller that generates first and second signals, wherein the first selector switches, in response to the first signal, a connection configuration where the first node is coupled to the fifth node to a connection configuration where the third node is coupled to the fifth node, and wherein the second selector switches, in response to the second signal, a connection configuration where the second node is coupled to the sixth node to a connection configuration where the fourth node is coupled to the sixth node.

9. The electric device according to claim 1, further comprising:

a channel selection controller that generates first and second signals, wherein the third selector switches, in response to the first and second signals, a connection configuration where the fifth node is coupled to the A/D converter to a connection configuration where the sixth node is coupled to the A/D converter.

10. The electric device according to claim 1, further comprising:

a first register that stores a first digital value output from the A/D converter, the first digital value corresponding to a potential of the first node; and a second register that stores a second digital value output from the A/D converter, the second digital value corresponding to a potential of the second node.

* * * * *